United States Patent
Nakamoto et al.

(10) Patent No.: US 8,969,172 B2
(45) Date of Patent: Mar. 3, 2015

(54) METHOD FOR FORMING ISOLATION STRUCTURE

(75) Inventors: Naoko Nakamoto, Shizuoka (JP);
Katsuchika Suzuki, Shizuoka (JP);
Shinji Sugahara, Shizuoka (JP);
Tatsuro Nagahara, Shizuoka (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 127 days.

(21) Appl. No.: 13/881,560

(22) PCT Filed: Nov. 2, 2011

(86) PCT No.: PCT/JP2011/075265
§ 371 (c)(1),
(2), (4) Date: Apr. 25, 2013

(87) PCT Pub. No.: WO2012/060399
PCT Pub. Date: May 10, 2012

(65) Prior Publication Data
US 2013/0214383 A1    Aug. 22, 2013

(30) Foreign Application Priority Data
Nov. 5, 2010 (JP) .................................. 2010-248290

(51) Int. Cl.
| | | |
|---|---|---|
| *H01L 21/76* | (2006.01) | |
| *H01L 21/762* | (2006.01) | |
| *H01L 21/02* | (2006.01) | |
| *H01L 29/06* | (2006.01) | |
| *H01L 21/3105* | (2006.01) | |

(52) U.S. Cl.
CPC .... *H01L 21/76224* (2013.01); *H01L 21/02126* (2013.01); *H01L 21/02222* (2013.01); *H01L 21/02282* (2013.01); *H01L 21/02326* (2013.01); *H01L 21/02337* (2013.01); *H01L 21/02343* (2013.01); *H01L 29/0649* (2013.01); *H01L 21/3105* (2013.01)
USPC ........... 438/435; 257/506; 438/433; 438/436; 438/437; 438/438

(58) Field of Classification Search
USPC .................. 257/506; 438/435, 433, 436–438
See application file for complete search history.

(56) References Cited

U.S. PATENT DOCUMENTS

| | | | |
|---|---|---|---|
| 6,746,714 B2 | 6/2004 | Aoki et al. | |
| 7,332,409 B2 * | 2/2008 | Cha et al. | ...................... 438/435 |

(Continued)

FOREIGN PATENT DOCUMENTS

| | | |
|---|---|---|
| JP | 11-116815 A | 4/1999 |
| JP | 2001-26415 A | 1/2001 |
| JP | 2002-75982 A | 3/2002 |
| JP | 2004-39902 A | 2/2004 |

(Continued)

*Primary Examiner* — Errol Fernandes
(74) *Attorney, Agent, or Firm* — Sangya Jain

(57) ABSTRACT

[Problem] To provide a method for forming an isolation structure having a low shrinkage percentage and a low tensile stress.

[Means for Solving] A first polysilazane composition containing a porogen is cast on the surface of a substrate to form a coat, and then the coat is fired to form a porous siliceous film having a refractive index of 1.3 or less. Thereafter, the surface of the porous siliceous film is soaked with a second polysilazane composition, and then fired to form an isolation structure of a siliceous film having a refractive index of 1.4 or more.

20 Claims, 1 Drawing Sheet

(56) References Cited

U.S. PATENT DOCUMENTS

| | | |
|---|---|---|
| 7,754,003 B2 | 7/2010 | Aoki et al. |
| 8,541,053 B2 * | 9/2013 | Menezes et al. ............. 427/240 |
| 2004/0028828 A1 | 2/2004 | Aoki et al. |
| 2004/0224537 A1 | 11/2004 | Lee et al. |
| 2005/0269662 A1 | 12/2005 | Ishitsuka et al. |
| 2006/0270170 A1 | 11/2006 | Arisumi et al. |
| 2007/0117892 A1 | 5/2007 | Aoki et al. |
| 2007/0281498 A1 | 12/2007 | Lee et al. |
| 2008/0182381 A1 | 7/2008 | Kiyotoshi |

FOREIGN PATENT DOCUMENTS

| | | |
|---|---|---|
| JP | 2004-331733 A | 11/2004 |
| JP | 2005-150702 | 6/2005 |
| JP | 2005-340327 A | 12/2005 |
| JP | 2006-188547 A | 7/2006 |
| JP | 2006-316077 A | 11/2006 |
| JP | 2006-332442 A | 12/2006 |
| JP | 2008-103645 A | 5/2008 |
| JP | 2008-235479 A | 10/2008 |
| WO | WO 2005/014744 A1 | 2/2005 |

* cited by examiner

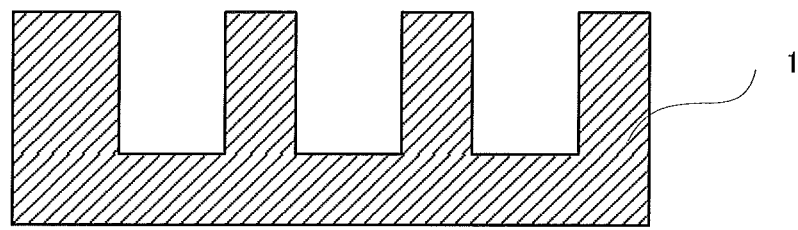
(A)
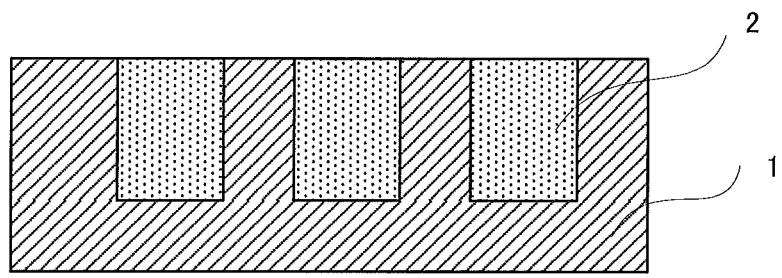
(B)
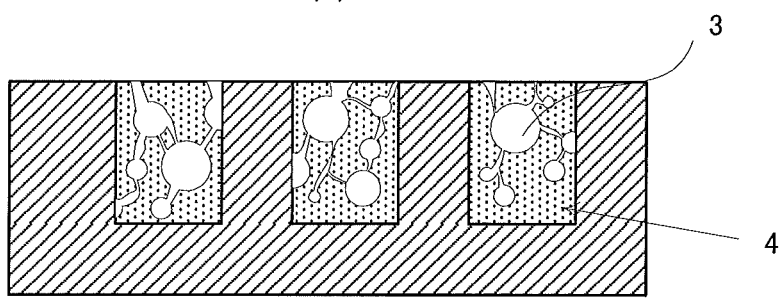
(C)
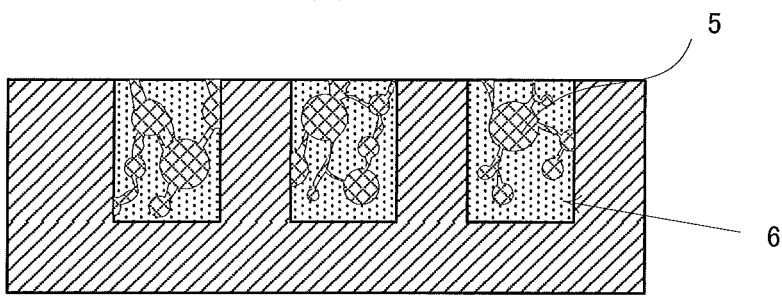
(D)

METHOD FOR FORMING ISOLATION STRUCTURE

This application is a U.S. National Stage patent application under 35 U.S.C. §371 of International Patent Application No. PCT/JP2011/075265, filed Nov. 2, 2011, which claims priority to Japanese Patent Application No. 2010-248290, filed Nov. 5, 2010, the contents of both documents being hereby incorporated herein by reference.

TECHNICAL FIELD

This invention relates to a method for forming insulating films in electronic devices.

BACKGROUND ART

In an electronic device such as a semiconductor element, semiconductor parts such as transistors, resistors and the like are generally arranged on a substrate. Those parts must be electrically insulated from each other, and hence it is necessary to provide an isolation structure among them so as to separate them.

Meanwhile, in the field of electronic devices, the density and integration degree have been increased in recent years. According to the increase of the density and integration degree, it has been required to form isolation structures minute enough to meet the needed integration degree. New isolation structures satisfying that requirement include a trench isolation structure, which is formed by carving fine trenches on the surface of a semiconductor substrate and then filling the trenches with insulating material so as to electrically separate a part positioned on one side from another part on the other side of each trench. The structure thus separating the parts can reduce the isolation area, as compared with the conventional structures, and is accordingly effective in achieving the high integration degree required in these days. In addition, if the parts are layered three-dimensionally to increase the density, it is also necessary to provide an insulating layer between layers of electro-conductive material. As the insulating layer, a pre-metal dielectric (PMD) or inter-metal dielectric (IMD) film is usable.

For forming the above isolation structures, some processes are developed. For example, there is a process in which a substrate surface having a trench structure is coated with a composition containing oxide precursor to fill the trenches in, and then fired to form an oxide film (Patent document 1). There is also a process in which the trenches on the substrate surface are filled with the composition containing oxide precursor and thereafter an insulating film is further inlaid therein by means of high density plasma CVD (Patent document 2). Further, still also a process is disclosed that comprises the steps of: coating a substrate surface with porous silica precursor to form a porous silica film, and then forming an oxide film thereon by CVD to form an interlayer insulating film (Patent document 3).

PRIOR ART DOCUMENTS

[Patent document 1] Japanese Patent Laid-Open No. 2005-150702
[Patent document 2] Japanese Patent Laid-Open No. 2008-103645
[Patent document 3] Japanese Patent Laid-Open No. 2008-235479
[Patent document 4] Japanese Patent No. 4408994
[Patent document 5] Japanese Patent Laid-Open No. 2002-075982
[Patent document 6] Japanese Patent Laid-Open No. 2004-331733
[Patent document 7] Japanese Patent Laid-Open No. 2006-188547
[Patent document 8] Japanese Patent Laid-Open No. 2006-316077
[Patent document 9] Japanese Patent Laid-Open No. 11(1999)-116815

DISCLOSURE OF INVENTION

Problem to be Solved by the Invention

However, when the insulating films provided by conventional methods for forming isolation structures are used in recent devices having very minute structures, fine trench walls therein are often unable to bear stress applied by the oxide films and, as a result, there are often problems of causing cracks and deformation of the substrate.

Means for Solving Problem

The present invention resides in a method for forming an isolation structure, comprising
a coating step, in which a first polysilazane composition containing a porogen is cast on the surface of a substrate to form a coat;
a first firing step, in which said coat is fired to form a porous siliceous film having a refractive index of 1.3 or less;
an impregnating step, in which said porous siliceous film is impregnated with a second polysilazane composition; and
a second firing step, in which said porous siliceous film is fired to form an isolation structure of a siliceous film having a refractive index of 1.4 or more.

Effect of the Invention

The present invention enables to form an isolation structure having a low shrinkage percentage and a low stress. This isolation structure can prevent a trench isolation structure from causing cracks and pattern collapse and also can prevent an insulating film from exfoliation.

BRIEF DESCRIPTION OF THE DRAWINGS

FIG. 1 shows schematic views illustrating the method for forming an isolation structure according to the present invention.

BEST MODE FOR CARRYING OUT THE INVENTION

The method of the present invention for forming an isolation structure can be applied to formation of various kinds of isolation structures. This means that, for example, the method can be used for inlaying a siliceous film into trenches or the like formed on a substrate and also for laying a siliceous film to cover a flat substrate surface or a substrate surface provided with electronic parts thereon.

The method for forming an isolation structure will be explained below with reference to the drawings, by way of example, in the case where a siliceous film is inlaid into trenches of a shallow trench isolation structure.

(A) Coating Step

First, a substrate 1 is prepared. The substrate 1 (FIG. 1(A)) is provided with ridges and furrows, which constitute a groove structure for forming a shallow trench isolation structure. There are no particular restrictions on the material of the substrate, and any known substrate such as a silicon substrate can be used. Further, the groove structure can be formed by any method. The concrete procedures are, for example, as follows.

In the first procedure, a siliceous film is formed on the surface of a silicon substrate by, for example, the thermal oxidation method. The siliceous film is generally made to have a thickness of 5 to 30 nm.

According to necessity, a silicon nitride film is then deposited on the formed siliceous film by, for example, the low-pressure CVD method. The silicon nitride film will function as a mask in the following etching procedure or as a stop layer in the polishing procedure described later. If formed, the silicon nitride film is so deposited as to have a thickness of generally 100 to 400 nm.

The siliceous or silicon nitride film thus formed is then coated with a photoresist. If necessary, after dried or hardened, the photoresist coat is subjected to exposure according to a desired pattern and then developed to form a pattern. The exposure can be carried out in any manner such as mask exposure or scanning exposure. The photoresist can be also freely selected in view of resolution and the like.

By use of the formed photoresist film as a mask, the silicon nitride film and the siliceous film laid thereunder are etched in order. As a result of this procedure, the desired pattern is formed on the silicon nitride film and the siliceous film.

The silicon substrate is then subjected to dry-etching by use of the patterned silicon nitride and siliceous films as a mask, to obtain the substrate 1 provided with trench isolation grooves (FIG. 1(A)).

The widths of the formed trench isolation grooves depend on the pattern used in the exposure of the photoresist coat. In general, the widths of trench isolation grooves in semiconductor elements are properly selected according to the aimed elements. However, the present invention shows excellent features in the case where the trench isolation grooves have narrow widths and high aspect ratios. Accordingly, the groove width a is preferably 5 to 50 nm, more preferably 5 to 40 nm. The aspect ratio b/a, which is a ratio of the groove depth b to the width a, is preferably 10 to 100, more preferably 10 to 50.

In the next procedure, the silicon substrate 1 thus prepared is coated with a material for constituting the basic structure of a siliceous film, namely, with a first polysilazane composition serving as a precursor of the film, to form a coat. The composition can be a solution obtained by dissolving any known polysilazane compound and a porogen in a solvent.

The polysilazane compound used in the present invention is not particularly restricted, and hence can be freely selected unless it impairs the effect of the invention. It may be either an inorganic or organic compound. Preferred examples of the polysilazane compound include a polysilazane comprising the following units (Ia) to (Ic) in combination:

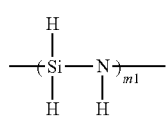

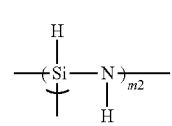

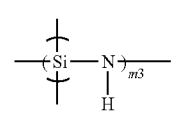

(wherein each of m1 to m3 is a number indicating the polymerization degree).

The above compound is an inorganic polysilazane compound referred to as "perhydropolysilazane". It is particularly preferred for the perhydropolysilazane to have a polystyrene-reduced weight average molecular weight of 700 to 30000.

Examples of the polysilazane compound also include: a polysilazane which has a skeleton mainly represented by the following formula (II):

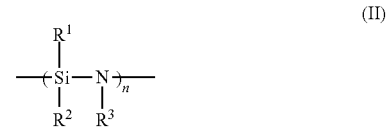

(wherein each of $R^1$, $R^2$ and $R^3$ is independently a hydrogen atom, an alkyl group, an alkenyl group, a cycloalkyl group, a cycloalkenyl group, an aryl group, an arylalkyl group, an alkylsilyl group, an alkylamino group, an alkoxy group, or another group, such as a fluoroalkyl group, which contains a carbon atom directly connecting to the silicon atom, provided that at least one of $R^1$, $R^2$ and $R^3$ is a hydrogen atom; and n is a number indicating the polymerization degree) and which has a number average molecular weight of about 100 to 50000; and modified compounds thereof. Organic polysilazanes like this compound function as precursors of the siliceous film, and further they may also function as porogens described below. Two or more of the above polysilazane compounds can be used in combination.

The first polysilazane composition used in the present invention contains a porogen. When the coat is dried and fired, the porogen partly decomposes and evaporates away to form voids in the siliceous film. There are no particular restrictions on the porogen, and examples thereof are as follows.

(a) Organic group-substituted polysilazane compound represented by the above formula (II)

When the coat is fired, the substituting organic groups are evaporated away to form voids according to the firing conditions. Accordingly, the compound serves not only as a material of the siliceous film but also as a porogen. Particularly preferred are polysilazane compounds having alkylsilyl groups, alkylamino groups or alkoxy groups.

(b) Polyacrylic acid and polymethacrylic acid (Patent documents 4 and 5)

(c) Organic resin which is selected from the group consisting of homo-polymers and co-polymers of acrylic esters and methacrylic esters and further which contains carboxyl groups or hydroxyl groups at, at least, a part of the pendant groups (Patent document 6)

(d) Siloxy group-containing polymer, such as, siloxy group-containing polyethyleneoxide compound or copolymer comprising that as a monomer unit (Patent documents 7 and 8)

Among the above porogens, particularly preferred is a polyaminosilazane having a structure in which hydrogen atoms of perhydropolysilazane are partly substituted with amino groups. Further preferred is a polyaminosilazane which has a number average molecular weight of about 800 or less and also which is represented by the following formula (III):

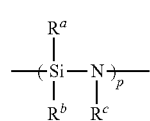

(wherein
each of $R^a$ and $R^b$ is independently a hydrogen atom or an amino group having a hydrocarbon substitutent, provided that $R^a$ and $R^b$ are not hydrogen atoms at the same time;

$R^c$ is a hydrogen atom or a hydrocarbon group;

in the case where $R^a$, $R^b$ or $R^c$ contains one or more hydrocarbon groups, each hydrocarbon group is independently an aliphatic or aromatic hydrocarbon group which is preferably selected from the group consisting of alkyl groups, alkenyl groups, cycloalkyl groups, cycloalkenyl groups, aryl groups and arylalkyl groups and further which has generally 20 or less, preferably 10 or less carbon atoms;

the hydrocarbon group is preferably an alkyl group having 1 to 8, particularly 1 to 4 carbon atoms; and p is a number indicating the polymerization degree).

The first polysilazane composition used in the present invention contains a solvent capable of dissolving the above polysilazane compound and porogen. The solvent used here is different from that used in the aforementioned impregnating solution. There are no particular restrictions on the solvent as long as it can dissolve the above components.

Preferred examples of the solvent include:
(a) aromatic compounds, such as benzene, toluene, xylene, ethylbenzene, diethylbenzene, trimethylbenzene and triethylbenzene; (b) saturated hydrocarbon compounds, such as n-pentane, i-pentane, n-hexane, i-hexane, n-heptane, i-heptane, n-octane, i-octane, n-nonane, i-nonane, n-decane and i-decane; (c) alicyclic hydrocarbon compounds, such as ethylcyclohexane, methylcyclohexane, cyclohexane, cyclohexene, p-menthane, decahydronaphthalene, dipentene and limonene; (d) ethers, such as dipropyl ether, dibutyl ether, diethyl ether, methyl tertiary butyl ether (hereinafter, referred to as MTBE) and anisole; and (e) ketones, such as methyl isobutyl ketone (hereinafter, referred to as MIBK). Among them, more preferred are (b) saturated hydrocarbon compounds, (c) alicyclic hydrocarbon compounds, (d) ethers and (e) ketones.

Those solvents can be used in combination of two or more, so as to control the evaporation rate, to reduce the hazardousness to the human body and to control the solubility of the components.

The first polysilazane composition used in the present invention can contain other additives, if necessary. Examples of the optional additives include crosslinking accelerators that promote the crosslinking reaction of polysilazane, catalysts of the reaction converting into silicon dioxide, and viscosity modifiers for controlling viscosity of the composition. Further, when used for producing a semiconductor devise, the composition can contain a phosphorus compound such as tris(trimethylsilyl)phosphate for the sake of Na-gettering effect.

The contents of the above components depend on the coating conditions and the firing conditions. However, the polysilazane composition contains the polysilazane compound in an amount of preferably 1 to 30 wt %, more preferably 2 to 20 wt %, based on the total weight of the composition. Nevertheless, this by no means restricts the concentration of polysilazane in the polysilazane composition, and the composition having any polysilazane concentration can be adopted as long as it can form the isolation structure specified by the present invention. The content of the porogen varies according to what kind of porogen is used, but is preferably 40 to 90 wt %, more preferably 50 to 90 wt %, based on the total weight of the polysilazane composition. The mixing ratio between the porogen and the polysilazane compound can be adjusted so as to control the refractive index of the siliceous film described later.

The first polysilazane composition can be cast on the substrate according to any coating method, such as spin coating, curtain coating, dip coating and the like. Among them, spin coating is particularly preferred in consideration of evenness of the formed coat. The thickness of the coat, that is, the thickness of the coat formed on the substrate surface in the area where the grooves are not provided, is preferably 20 to 150 nm, more preferably 30 to 100 nm. If the coat is too thick, the evenness thereof is often impaired. On the other hand, it should be noted that, if it is too thin, the polysilazane composition is often supplied insufficiently to fill the grooves in, and consequently the trench side-walls may collapse or it may be impossible to form a siliceous film having enough thickness. Thus in this coating step, the trenches are filled with the first polysilazane composition 2 (FIG. 1(B)).

(B) First Firing Step

After the coating step, the coat is fired so as to convert the whole coat into a siliceous film. The firing procedure for converting the coat into a porous siliceous film is preferably carried out in a hardening furnace or on a hot-plate under an inert gas or oxygen atmosphere containing water vapor. The water vapor is important for sufficiently converting a silicon-containing compound or a silicon-containing polymer and, if present, a poly-silazane compound into silicon dioxide. The water vapor content is preferably 1% or more, further preferably 10% or more, most preferably 20% or more. It is particularly preferred that the water vapor content be 20% or more. If so, the silazane compound is smoothly converted into a siliceous film and consequently defects such as voids are less formed to improve the properties of the siliceous film. In the case where the inert gas is adopted as the atmospheric gas, nitrogen, argon and helium are usable.

The temperature for hardening depends on various conditions such as the kind of the used polysilazane composition and the combination of the steps. However, at a high temperature, the film of the silicon-containing compound, the silicon-containing polymer and the polysilazane compound is apt to be rapidly converted into a siliceous film. On the other hand, at a low temperature, the silicon substrate is apt to less suffer from oxidization and the crystal structure thereof is apt to less change, and accordingly the properties of the device are less deteriorated. In view of this, the firing step in the method according to the present invention is carried out at a temperature of normally 200 to 1000° C., preferably 400 to 900° C. The rate of heating to the aimed temperature is generally 1 to 100° C./minute, and the aimed temperature for hardening is kept for generally 1 minute to 10 hours, preferably 15 minutes to 3 hours. If necessary, the temperature and atmosphere for hardening can be step-by-step changed.

Further, according to necessity, additional heating can be carried out. The additional heating is for the purpose of further advancing the reaction caused by the firing. Since the reaction has already proceeded in the first firing, the additional heating can be conducted in an atmosphere without water vapor, for example, in an atmosphere of inert gas such as nitrogen or argon. The additional heating can be generally performed at a temperature higher than the first firing, but the heating temperature is normally 1000° C. or below.

In this firing step, the volatile component of the porogen evaporates or sublimates away from the coat. As a result, voids 3 are formed in the siliceous film to form a porous siliceous film 4 (FIG. 1(C)). This kind of siliceous film is characterized by having a relatively low refractive index, and actually the siliceous film obtained by the first firing step of the present invention has a refractive index of 1.35 or less, preferably of 1.3 or less. The refractive index can be measured by means of an M-44 spectroscopic ellipsometer ([trademark], manufactured by J. A. Woollam Co., Inc.).

(C) Impregnating Step

In the next step, the obtained porous film is impregnated with a second polysilazane composition. The second polysilazane composition used here contains a polysilazane compound but does not contain a porogen. The components, such as the polysilazane compound, solvent and other additives, in the second polysilazane composition are preferably the same as those except the porogen in the first polysilazane composition. If comprising those materials, the second polysilazane composition gives a siliceous substance having high affinity with the porous siliceous film and, as a result, is likely to improve cracks or deformation of the substrate.

The amounts of the components in the second polysilazane composition are preferably determined within the ranges thereof described above for those in the first polysilazane composition. However, since the composition needs to soak into fine voids, it is generally preferred for the composition to have low viscosity.

There are no particular restrictions on the method for impregnating the second polysilazane composition into the porous siliceous film, and hence any method can be adopted. For example, the porous siliceous film may be immersed in the second polysilazane composition, or otherwise the surface of the porous siliceous film may be coated with the second polysilazane composition according to spin-coating or brush coating. The amount of the polysilazane compound in the second polysilazane composition is properly controlled according to the coating method and the like. For example, in the case where the composition is soaked by immersion or by spin-coating, the content of the polysilazane compound is preferably 3 to 18%, more preferably 5 to 16%, based on the total weight of the composition. Further, if spin-coating is carried out, the coating condition is preferably 500 to 3000 rpm, more preferably 700 to 2000 rpm. The second polysilazane composition preferably has low viscosity because it must soak into the porous siliceous film formed beforehand. On the other hand, however, in order that the soaked composition can be retained in the voids or openings, it preferably has high viscosity. Accordingly, the proper concentration of the second polysilazane composition is within a range narrower than that of the first poly-silazane composition.

In the way described above, the substrate surface is brought into contact with the second polysilazane composition, so that the porous siliceous film can be impregnated with the composition. Since the voids are formed by the particular component evaporating away from the siliceous film, there are continuous paths between the substrate surface and most of the voids. Accordingly, the composition applied on the substrate surface trickles into the voids through the paths (FIG. 1(D)). The coated substrate may be left until the siliceous film is completely impregnated with the composition, if necessary. However, the impregnation is normally completed immediately, and hence it is not particularly necessary to leave the substrate.

(D) Second Firing Step

After the second polysilazane composition is made to trickle into the voids, the substrate is further fired to form a siliceous substance 5 in the voids. As a result of this firing step, the voids in the porous siliceous film are filled with the siliceous substance to produce an aimed siliceous film (insulating film) 6. The firing procedure can be carried out under the same conditions as those in the first firing step.

It is necessary that at least one of the first and second firing steps be carried out in an inert gas or oxygen atmosphere containing water vapor. Preferably, both of the first and second firing steps are carried out in an inert gas or oxygen atmosphere containing water vapor.

Since the siliceous film 6 after the second firing step contains the voids filled with the siliceous substance 5, it has a higher refractive index than the porous siliceous film after the first firing step. In fact, the resultant siliceous film has a refractive index of 1.4 or more, preferably 1.42 or more.

The difference of the refractive index between the porous siliceous film after the first firing step and the siliceous film after the second firing step is preferably 0.05 or more, further preferably 0.12 or more.

The shallow trench isolation structure obtained thus according to the present invention has a low shrinkage percentage and a reduced tensile stress at the part near the grooves, and is hence characterized by having high physical strength. The reason why those characteristics are achieved is presumed to be that: the trenches are first filled to some depth with a siliceous film having a relatively low shrinkage percentage and then filled completely with another siliceous film having a relatively high shrinkage percentage, so that the trenches can be filled with a reduced amount of the siliceous film having a high shrinkage percentage.

The method of the present invention for forming an isolation structure indispensably comprises the above (A) to (D) steps, but may further comprises the following auxiliary steps in combination.

(a) Solvent-Removing Step

After the coating or impregnating step before firing, the substrate coated with the polysilazane composition can be subjected to pre-bake treatment. This step is carried out for the purpose of removing the solvent at least partly from the coat.

In the solvent-removing step, the substrate is normally heated at an essentially constant temperature. The solvent-removing step should be carried out under the conditions that the polysilazane does not substantially undergo oxidation or polymerization. Accordingly, the temperature in the solvent-removing step is in the range of normally 50 to 250° C., preferably 80 to 200° C. The time for the solvent-removing step is generally 0.5 to 10 minutes, preferably 1 to 5 minutes.

(b) Polishing Step

After firing, unnecessary parts of the formed siliceous film are preferably removed. For the purpose of that, the siliceous film formed on the flat surface of the substrate is removed by polishing while that formed in the grooves are left. This procedure is a polishing step. The polishing step may be carried out after the hardening treatment or immediately after pre-baking if the pre-baking step is performed in combination.

The polishing step is performed according to a CMP process. The CMP process can be carried out by use of normal abrasives and abrasive apparatus. Examples of the abrasives include silica, alumina, ceria, and aqueous suspension dispersing those and, if necessary, other abrasives. The abrasive apparatus is, for example, a commercially available normal CMP apparatus.

(c) Etching Step

As a result of the above polishing step, the siliceous film formed from the polysilazane composition is almost removed from the flat surface of the substrate. However, for removing the residual siliceous film on the flat surface, etching treatment is preferably performed. In the etching treatment, etching solution is generally used. There are no particular restrictions on the etching solution as long as it can remove the residual siliceous film. The etching solution is normally a hydrofluoric acid aqueous solution containing ammonium fluoride. The content of ammonium fluoride in the solution is preferably 5% or more, more preferably 30% or more.

The case explained above is an example where the method of the present invention for forming an isolation structure is applied to formation of a shallow trench isolation structure. However, this method can be also applied to formation of a PMD or IMD insulating film in the same manner. In that case, a flat semiconductor substrate or a substrate provided with electric parts on its surface can be used as the substrate. However, in view of heat resistance of the electric parts, it may be necessary to control the thermal conditions.

The present invention is further explained below by use of the following examples.

PREPARATION EXAMPLE 1

Preparation of Porogen

Xylene as a reaction solvent was placed in a small-sized pressure vessel, which was then airtightly sealed. After 200.0 g (1.18 mol) of tetrachlorosilane was incorporated in the solvent, 291.6 g (9.38 mol) of methylamine was added with stirring for 100 minutes to obtain polyaminosilazane as a porogen. The obtained polymer had a weight average molecular weight of 555.

PREPARATION EXAMPLE 2

Preparation of Perhydropoly-Silazane

According to the method described in Patent document 9, perhydropolysilazane was synthesized in the following manner.

A 2 L four-necked flask was mounted with a gas-blowing tube, a mechanical stirrer and a Dewar condenser. After air in the flask was substituted with dry nitrogen, 1500 mL of dry pyridine was placed in the flask and then cooled with ice. Subsequently, 100 g of dichlorosilane was added to form a white solid adduct ($SiH_2Cl_2 \cdot 2C_5H_5N$). While the reaction mixture was cooled with ice, 70 g of ammonia was blown therein with stirring. Successively, dry nitrogen was blown into the liquid phase for 30 minutes, to remove excess of the ammonia.

The product was filtered through a Büchner funnel under reduced pressure in a dry nitrogen atmosphere, to obtain 1200 mL of the filtrate. From the filtrate, pyridine was distilled away by means of an evaporator to obtain 40 g of perhydropolysilazane. The number average molecular weight of the obtained perhydropoly-silazane was measured by GPC (eluent: $CDCl_3$) and found to be 800 in terms of polystyrene standard. Further, the IR spectrum thereof was also measured, and consequently it was verified that there were absorption peaks attributed to N—H at 3350 $cm^{-1}$ and 1200 $cm^{-1}$, to Si—H at 2170 $cm^{-1}$ and to Si—N—Si in 1020 to 820 $cm^{-1}$.

EXAMPLE 1

The porogen obtained in Preparation example 1 and a dibutyl ether solution containing 20 wt % of the perhydropolysilazane were mixed so that the ratio of their solid contents might be 85:15, to prepare a first polysilazane composition. The composition was cast on a substrate by spin-coating and dried at 150° C. for 3 minutes. Successively, the coated substrate was subjected to the first firing step at 400° C. for 30 minutes under an atmosphere in which a mixed gas of oxygen and water vapor ($H_2O/(O_2+H_2O)$=80 mol %) flowed at 8 L/minute. Further, the substrate was subjected to additional heating at 850° C. for 30 minutes under a nitrogen atmosphere, to obtain a porous siliceous film. The porous siliceous film was found to have a refractive index of 1.27.

Subsequently, the surface of the porous siliceous film was spin-coated with a second polysilazane composition in which 10 wt % of the perhydropoly-silazane obtained in Preparation example 2 was dissolved in dibutyl ether. The coated porous siliceous film was then subjected to the second firing step under the same conditions as those of the first firing step, to obtain a siliceous film (insulating film). The siliceous film was found to have a refractive index of 1.43.

COMPARATIVE EXAMPLE 1

A substrate was spin-coated with a dibutyl ether solution containing 10 wt % of perhydropolysilazane (Spinfil 450 [trademark], manufactured by AZ Electronic Materials Ltd.), and dried. The coated substrate was then fired under the same conditions as those of the first firing step in Example 1, to obtain a siliceous film for comparison.

Observation of Sections

With respect to the siliceous film obtained in Example 1 and the porous siliceous film before the impregnating step in Example 1, their sections were observed by scanning electron microscopy. As a result, many voids were found in the section of the film before the impregnating step and hence the film was verified to be porous. On the other hand, voids were scarcely found in the section of the siliceous film obtained in Example 1, and hence it was also verified to be a dense film in which voids were filled with the siliceous substance.

Evaluation on Characteristics and Electric properties

With respect to the siliceous films obtained in Examples 1 and 2 and the porous siliceous film before the impregnating step in Example 1, the shrinkage percentages and the tensile stresses were measured. Each evaluation was carried out in the following manner.

(a) Shrinkage Percentage

The thickness of the film was measured before and after firing by means of an M-44 spectroscopic ellipso-meter ([trademark], manufactured by J. A. Woollam Co., Inc.), to calculate the shrinkage percentage.

(b) Tensile Stress

Data on a warp in a silicon wafer having sizes of 10.16 cm diameter and 0.5 mm thickness were inputted into a FLX-2320 laser inner stress measurement system ([trademark], manufactured by KLA-Tencor Corporation).

Thereafter, the siliceous film was formed on the silicon wafer in the same manner as each example, and then the tensile stress thereof was measured at 23° C. by means of the above system. The thickness necessary for the measurement of tensile stress was determined by means of an M-44 spectroscopic ellipsometer ([trade-mark], manufactured by J. A. Woollam Co., Inc.).

The results were shown in Table 1.

TABLE 1

Characteristics of siliceous films

| | Tensile stress MPa | Shrinkage percentage % |
|---|---|---|
| Comparative Example | 39.1 | 17.0 |
| Example 1 (before the impregnating step) | −23.1 | 10.7 |
| Example 1 | −7.7 | 14.9 |

The siliceous film of Example 1, which was produced according to the method of the present invention, was found to have a lower shrinkage percentage and a lower tensile stress than those of Comparative Example 1. In general, cracks in siliceous films and deformation of substrates are presumed to be caused by shrinkage and tensile stress in the production process, particularly in the firing procedure. Accordingly, the low shrinkage percentage and low tensile stress enable to improve the cracks and the deformation of substrates. Further, in the same manner as each of Example 1 and Comparative Example 1, the siliceous film was formed on a substrate provided with narrow trenches. As a result, although cracks were formed in the siliceous film according to Comparative Example 1, the film according to Example 1 succeeded in avoiding formation of cracks.

COMPARATIVE EXAMPLE 2

The porogen obtained in Preparation example 1 and a dibutyl ether solution containing 20 wt % of the perhydropolysilazane were mixed so that the ratio of their solid contents might be 30:70, to prepare a first polysilazane composition. From the prepared composition, a porous siliceous film was formed under the same conditions as those in Example 1. The siliceous film was found to have a refractive index of 1.42 and a shrinkage percentage of 22%, which was higher than that in Comparative Example 1. Further, cracks were observed in the siliceous film. That is presumed to be because the porogen was used in too small an amount.

COMPARATIVE EXAMPLE 3

The procedures of Example 1 were repeated except for changing the atmosphere of the first firing step into a dry oxygen atmosphere, to form a siliceous film. The formed siliceous film was found to have cracks. That is presumed to be because both of the first and second firing steps were carried out in atmospheres without water vapor.

EXAMPLE 2

The porogen obtained in Preparation example 1 and a dibutyl ether solution containing 20 wt % of the perhydropolysilazane were mixed so that the ratio of their solid contents might be 50:50, to prepare a first polysilazane composition. By use of this composition, the first firing step was carried out under the same conditions as those in Example 1, to obtain a porous siliceous film having a refractive index of 1.30. The porous siliceous film was coated with the second polysilazane composition and then fired in the same manner as in Example 1, to obtain a siliceous film (insulating film). The obtained siliceous film had a refractive index of 1.44, a tensile stress of 7.3 MPa and a shrinkage percentage of 22%. Further, it was verified that cracks were not formed in the siliceous film.

EXAMPLE 3

The porogen obtained in Preparation example 1 and a dibutyl ether solution containing 20 wt % of the perhydropolysilazane were mixed so that the ratio of their solid contents might be 90:10, to prepare a first polysilazane composition. By use of this composition, the first firing step was carried out under the same conditions as those in Example 1, to obtain a porous siliceous film having a refractive index of 1.22. The porous siliceous film was coated with the second polysilazane composition and then fired in the same manner as in Example 1, to obtain a siliceous film (insulating film). The obtained siliceous film had a refractive index of 1.44, a tensile stress of −15.1 MPa and a shrinkage percentage of 14.1%. Further, it was verified that cracks were not formed in the siliceous film.

The procedures of Example 1 were repeated except for changing the perhydropolysilazane content in the second polysilazane composition into 15 wt %, to obtain a siliceous film (insulating film). The obtained siliceous film had a refractive index of 1.43, a tensile stress of −12.9 MPa and a shrinkage percentage of 15.6%. Further, it was verified that cracks were not formed in the siliceous film.

Description of the Numerals

1: substrate
2: first polysilazane composition
3: voids
4: porous siliceous film
5: siliceous substance
6: siliceous film (insulating film)

The invention claimed is:

1. A method for forming an isolation structure, comprising
a coating step, in which a first polysilazane composition containing a porogen is cast on the surface of a substrate to form a coat;
a first firing step, in which said coat is fired to form a porous siliceous film having a refractive index of 1.35 or less;
an impregnating step, in which said porous siliceous film is impregnated with a second polysilazane composition; and
a second firing step, in which said porous siliceous film is fired to form an isolation structure of a siliceous film having a refractive index of 1.4 or more;
wherein
at least one of the first and second firing steps is carried out in an inert gas or oxygen atmosphere containing water vapor.

2. The method according to claim 1, wherein said first and second polysilazane compositions contain perhydropoly-silazane.

3. The method according to claim 1, wherein said porogen is polyaminosilazane.

4. The method according to claim 1, wherein both or either of the first and second firing steps are carried out in an inert gas or oxygen atmosphere containing water vapor.

5. The method according to claim 1, wherein at least one of the first and second firing steps is carried out at a temperature of 200 to 1000° C.

6. The method according to claim 1, wherein said substrate has a surface provided with grooves in which the isolation structure of the siliceous film is formed to form a shallow trench isolation structure.

7. An insulating film formed by the method according to claim 1.

8. A substrate provided with an isolation structure formed by the method according to claim 1.

9. The method according to claim 2, wherein said porogen is polyaminosilazane.

10. The method according to claim 2, wherein both or either of the first and second firing steps are carried out in an inert gas or oxygen atmosphere containing water vapor.

11. The method according to claim 3, wherein both or either of the first and second firing steps are carried out in an inert gas or oxygen atmosphere containing water vapor.

12. The method according to claim 1 wherein said porogen is a poly-silazane having following formula (II),

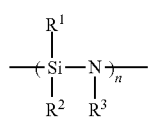

(II)

wherein $R^1$, $R^2$ and $R^3$ are independently chosen from the group consisting of a hydrogen atom, an alkyl group, an alkenyl group, a cycloalkyl group, a cycloalkenyl group, an aryl group, an arylalkyl group, an alkylsilyl group, an alkylamino group, an alkoxy group, and a fluoroalkyl group, and further wherein a carbon atom is directly connected to the silicon atom, provided that at least one of $R^1$, $R^2$ and $R^3$ is a hydrogen atom and further wherein at least one of $R^1$, $R^2$ and $R^3$ is chosen from the group consisting of an alkylsilyl group, an alkylamino group and an alkoxy group.

13. The method according to claim 1 wherein said porogen is a polyaminosilazane which has a number average molecular weight of 800 or less having formula (III),

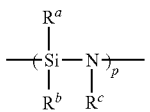

(III)

wherein $R^a$ and $R^b$ are independently a hydrogen atom, or an amino group having a hydrocarbon substitutent, provided that $R^a$ and $R^b$ are not hydrogen atoms at the same time and further wherein $R^c$ is a hydrogen atom or a hydrocarbon group wherein the hydrocarbon has less than 20 carbon atoms.

14. The method according to claim 1 wherein the first polysilazane composition is a poly-silazane comprising units (Ia), (Ib) and (Ic) and having formula (I), (I)

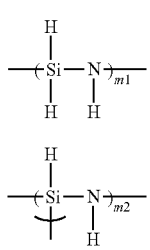

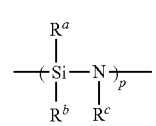

wherein m1, m2, and m3 are the degree of polymerization of each unit and further where the weight average molecular weight of the first polysilazane composition is 700 to 30000, and further wherein the porogen is a poly-silazane having following formula (II),

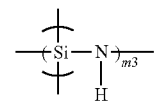

(II)

wherein $R^1$, $R^2$ and $R^3$ are independently chosen from the group consisting of a hydrogen atom, an alkyl group, an alkenyl group, a cycloalkyl group, a cycloalkenyl group, an aryl group, an arylalkyl group, an alkylsilyl group, an alkylamino group, an alkoxy group, and a fluoroalkyl group, and further wherein a carbon atom is directly connecting to the silicon atom, provided that at least one of $R^1$, $R^2$ and $R^3$ is a hydrogen atom and further wherein at least one of $R^1$, $R^2$ and $R^3$ is chosen from the group consisting of an alkylsilyl group, an alkylamino group and an alkoxy group.

15. The method according to claim 1 wherein the first polysilazane composition is a poly-silazane comprising units (Ia), (Ib) and (Ic) and having formula (I), (I)

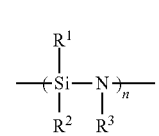

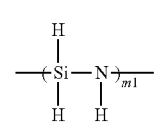

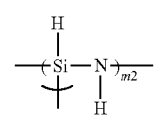

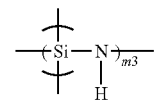

wherein m1, m2, and m3 are the degree of polymerization of each unit and further where the weight average molecular weight of the first polysilazane composition is 700 to 30000, and further wherein the porogen is a is a polyaminosilazane which has a number average molecular weight of 800 or less and is represented by formula (III),

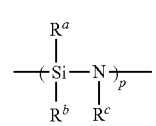

(III)

wherein $R^a$ and $R^b$ are independently a hydrogen atom, or an amino group having a hydrocarbon substitutent, provided that $R^a$ and $R^b$ are not hydrogen atoms at the same time and further wherein $R^c$ is a hydrogen atom or a hydrocarbon group wherein the hydrocarbon has less than 20 carbon atoms.

16. The method according to claim 1 wherein the first polysilazane composition is a poly-silazane comprising units (Ia), (Ib) and (Ic) and having formula (I), (I)

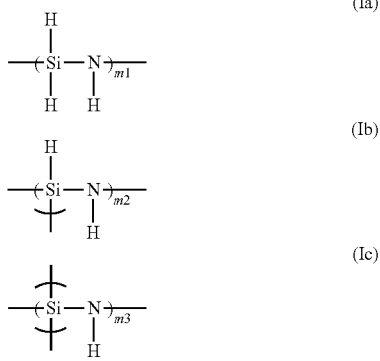

(Ia)

(Ib)

(Ic)

wherein m1, m2, and m3 are the degree of polymerization of each unit and further where the weight average molecular weight of the first polysilazane composition is 700 to 30000, and further wherein the porogen is a poly-silazane having following formula (II),

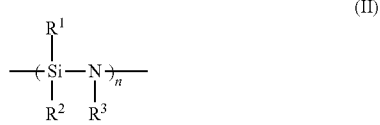

(II)

wherein $R^1$, $R^2$ and $R^3$ are independently chosen from the group consisting of a hydrogen atom, an alkyl group, an alkenyl group, a cycloalkyl group, a cycloalkenyl group, an aryl group, an arylalkyl group, an alkylsilyl group, an alkylamino group, an alkoxy group, and a fluoroalkyl group, and further wherein a carbon atom is directly connecting to the silicon atom, provided that at least one of $R^1$, $R^2$ and $R^3$ is a hydrogen atom and further wherein at least one of $R^1$, $R^2$ and $R^3$ is chosen from the group consisting of an alkylsilyl group, an alkylamino group and an alkoxy group.

17. The method according to claim 1 wherein the first polysilazane composition is a composition having the following formula (II),

(II)

wherein $R^1$, $R^2$ and $R^3$ are independently chosen from the group consisting of a hydrogen atom, an alkyl group, an alkenyl group, a cycloalkyl group, a cycloalkenyl group, an aryl group, an arylalkyl group, an alkylsilyl group, an alkylamino group, an alkoxy group, and a fluoroalkyl group, and further wherein a carbon atom is directly connected to the silicon atom, provided that at least one of $R^1$, $R^2$ and $R^3$ is a hydrogen atom and further wherein the poragen is a polyaminosilazane which has a number average molecular weight of 800 or less and is represented by formula (III),

(III)

wherein $R^a$ and $R^b$ are independently a hydrogen atom, or an amino group having a hydrocarbon substitutent, provided that $R^a$ and $R^b$ are not hydrogen atoms at the same time and further wherein $R^c$ is a hydrogen atom or a hydrocarbon group wherein the hydrocarbon has less than 20 carbon atoms.

18. The method according to claim 1 wherein the first polysilazane composition is composition having the following formula (II),

(II)

wherein $R^1$, $R^2$ and $R^3$ are independently chosen from the group consisting of a hydrogen atom, an alkyl group, an alkenyl group, a cycloalkyl group, a cycloalkenyl group, an aryl group, an arylalkyl group, an alkylsilyl group, an alkylamino group, an alkoxy group, and a fluoroalkyl group, and further wherein a carbon atom is directly connected to the silicon atom, provided that at least one of $R^1$, $R^2$ and $R^3$ is a hydrogen atom and further wherein the poragen and further wherein the porogen is a poly-silazane having formula (II), wherein $R^1$, $R^2$ and $R^3$ are independently chosen from the group consisting of a hydrogen atom, an alkyl group, an alkenyl group, a cycloalkyl group, a cycloalkenyl group, an aryl group, an arylalkyl group, an alkylsilyl group, an alkylamino group, an alkoxy group, and a fluoroalkyl group, and further wherein a carbon atom is directly connected to the silicon atom, provided that at least one of $R^1$, $R^2$ and $R^3$ is a hydrogen atom and further wherein at least one of $R^1$, $R^2$ and $R^3$ is chosen from the group consisting of an alkylsilyl group, an alkylamino group and an alkoxy group.

19. The method according to claim 1 wherein the second polysilazane composition is a composition having the following formula (II),

(II)

wherein $R^1$, $R^2$ and $R^3$ are independently chosen from the group consisting of a hydrogen atom, an alkyl group, an alkenyl group, a cycloalkyl group, a cycloalkenyl group, an aryl group, an arylalkyl group, an alkylsilyl group, an alkylamino group, an alkoxy group, and a fluoroalkyl group, and further wherein a carbon atom is directly connected to the silicon atom, provided that at least one of $R^1$, $R^2$ and $R^3$ is a hydrogen atom.

20. The method according to claim 1 wherein the second polysilazane composition is a composition having the following formula (II),
(II)
wherein $R^1$, $R^2$ and $R^3$ are hydrogen atoms.
* * * * *